(12) United States Patent
Pouilly et al.

(10) Patent No.: US 12,048,129 B2
(45) Date of Patent: Jul. 23, 2024

(54) MODULAR ELECTRICAL ASSEMBLY COMPRISING AN INTEGRATED COOLING SYSTEM

(71) Applicant: Valeo eAutomotive France SAS, Cergy (FR)

(72) Inventors: Aurélien Pouilly, Cergy (FR); Alexandre Legendre, Cergy (FR)

(73) Assignee: Valeo eAutomotive France SAS, Cergy (FR)

( * ) Notice: Subject to any disclaimer, the term of this patent is extended or adjusted under 35 U.S.C. 154(b) by 0 days.

(21) Appl. No.: 18/041,306

(22) PCT Filed: Jul. 15, 2021

(86) PCT No.: PCT/EP2021/069908
§ 371 (c)(1),
(2) Date: Feb. 10, 2023

(87) PCT Pub. No.: WO2022/033802
PCT Pub. Date: Feb. 17, 2022

(65) Prior Publication Data
US 2023/0301038 A1 Sep. 21, 2023

(30) Foreign Application Priority Data
Aug. 13, 2020 (FR) ...................................... 2008487

(51) Int. Cl.
*G06F 1/16* (2006.01)
*H05K 5/00* (2006.01)
(Continued)

(52) U.S. Cl.
CPC ......... *H05K 7/20845* (2013.01); *H05K 7/026* (2013.01); *H05K 7/2089* (2013.01)

(58) Field of Classification Search
CPC ... H05K 7/20845; H05K 7/026; H05K 7/2089
See application file for complete search history.

(56) References Cited

U.S. PATENT DOCUMENTS 7,885,074 B2 * 2/2011 Campbell ............. H01L 23/427
361/679.52
9,901,008 B2 * 2/2018 Shedd ................ H05K 7/20327
(Continued)

FOREIGN PATENT DOCUMENTS

JP 2005-137116 A 5/2005

OTHER PUBLICATIONS

International Search Report mailed on Oct. 14, 2021 in PCT/EP2021/069908 filed on Jul. 15, 2021 (3 pages).

*Primary Examiner* — Anthony M Haughton
(74) *Attorney, Agent, or Firm* — Oblon, McClelland, Maier & Neustadt, L.L.P.

(57) ABSTRACT

The invention relates to an electrical assembly, in particular for a vehicle, comprising a casing (13), at least one electrical module (11) having at least one electrical component to be cooled, a cooling module (12) comprising at least two fluid orifices (122), at least one cooling duct provided in said cooling module (12), configured to form a portion of a cooling circuit and to provide a fluidic connection between said fluid orifices (122), said at least one electrical module (11) being connected to said cooling module (12) in order for the electrical module (11) to be cooled, said casing (13) being connected to said cooling module (12) so as to define a free volume, said free volume accommodating said at least one electrical module (11) so as to form an independent module configured to be connected to a frame of an item of electrical equipment.

20 Claims, 3 Drawing Sheets

(51) Int. Cl.
    *H05K 7/00*      (2006.01)
    *H05K 7/02*      (2006.01)
    *H05K 7/20*      (2006.01)

(56) References Cited

U.S. PATENT DOCUMENTS

| | | | |
|---|---|---|---|
| 10,707,771 | B1 | 7/2020 | Chen et al. |
| 11,398,762 | B2 * | 7/2022 | Kobayashi ............. H02K 11/33 |
| 2008/0130223 | A1 | 6/2008 | Nakamura et al. |
| 2008/0198548 | A1 | 8/2008 | Nakamura et al. |
| 2010/0188813 | A1 | 7/2010 | Nakatsu et al. |
| 2010/0188814 | A1 | 7/2010 | Nakatsu et al. |
| 2011/0235270 | A1 | 9/2011 | Nakatsu et al. |
| 2012/0168118 | A1 * | 7/2012 | Myers ..................... F01P 11/08 |
| | | | 165/51 |
| 2013/0223009 | A1 | 8/2013 | Nakatsu et al. |
| 2015/0313040 | A1 | 10/2015 | Nakatsu et al. |
| 2016/0056516 | A1 * | 2/2016 | Srinivasan .............. B60L 58/26 |
| | | | 429/120 |
| 2017/0321794 | A1 * | 11/2017 | Kiehlneker ......... F04C 15/0015 |
| 2018/0034119 | A1 * | 2/2018 | Siering ............... H01M 10/613 |
| 2019/0275895 | A1 | 9/2019 | Jeong |
| 2020/0006826 | A1 * | 1/2020 | Einoegg ............ H01M 10/6567 |
| 2021/0178902 | A1 * | 6/2021 | Liu ................... H01M 10/6552 |
| 2022/0278393 | A1 * | 9/2022 | Becker ............. H01M 10/6556 |

* cited by examiner

MODULAR ELECTRICAL ASSEMBLY COMPRISING AN INTEGRATED COOLING SYSTEM

TECHNICAL FIELD

The present invention relates to the field of electrical devices, particularly for vehicles, in particular for electric or hybrid vehicles. More specifically, the present invention relates to an electrical assembly comprising an integrated cooling system, for a power electrical device, in particular a DC/DC converter, an electrical charger, or an inverter.

Generally, in electric propulsion systems, it is necessary to provide cooling systems for certain electrical devices, in particular the motor, the DC/DC converter, the electrical charger, and the inverter.

As is known, a power electrical device, in particular an inverter, generally comprises at least one power electronics module and one capacitor module, in order to convert the electricity from the battery into electricity that can be used by the electric motor. Generally, the inverter also makes it possible to recover electricity from the electric motor in order to store it in the battery.

It must be noted that "power electronics module" is given to mean an assembly comprising components through which passes energy powering the electric machine, which are in particular suitable for converting direct current into alternating current or vice versa. These components can comprise electronic switches, such as for example semiconductor transistors, arranged in an electrical circuit so as to allow a controlled flow of electrical energy between the high-voltage power supply battery and the electric machine. In particular, the components are bare semiconductor chips a casing of which forms a body producing a capsule. In other words, a power electronics module is an assembly comprising a plurality of semiconductor chips forming an electrical circuit that are encapsulated in a single casing.

Generally, a power electrical device comprises a plurality of electrical components that must be cooled.

To this end, according to the prior art, a fluid-based cooling system configured to convey a coolant, in particular liquid water, is incorporated into the electric propulsion systems, in order to cool the plurality of electrical components of the power electrical device.

Such a cooling system comprises at least one fluid inlet and one fluid outlet, in order to fluidly connect a plurality of cooling circuit portions. In practice, the fluid inlet or outlet takes the form of a nozzle, or a spigot.

Said cooling system must generally satisfy a number of constraints in terms of footprint, accessibility and cooling efficiency.

It therefore seems desirable to share a single portion of cooling circuit in order to cool a plurality of electrical components, optimize the use of the available heat exchange surfaces, and reduce as far as possible the length of the cooling circuit, in order to allow efficient coolant flow and thus avoid pressure drops in the flow of the coolant.

To this end, prior art document US 2018219488 A1 describes a power electrical device comprising a housing, a plurality of electrical components to be cooled, in particular a power electronics module, and an integrated cooling system. The cooling system described by US 2018219488 A1 comprises two cooling modules providing four main heat exchange surfaces, in order to cool the plurality of electrical components.

However, the housing described by US 2018219488 A1 comprises channels made in the mass of the housing that are configured to fluidly connect the two cooling modules, making the production of such a housing complex and expensive. The implementation of such a housing requires expensive molding technology, in particular a gravity casting process with the use of cores, and entails carrying out a large proportion of the tests, in particular leak tests, at the end of the process for manufacturing the power electrical device which is expensive in the event of failure of said leak tests.

In addition, as is known, the fluid inlet and outlet generally form part of a single element of the housing and the positioning of the fluid inlet and outlet is generally restricted to the same side of said housing. This constraint can cause the lengthening of the cooling circuit, and as a result cause a pressure drop in the flow of the fluid, which is undesirable in the cooling circuit.

Furthermore, systems for cooling power electrical devices require the use of a plurality of seals. By way of example, the power electrical device described in US 2018219488 A1 requires at least three seals in addition to the seals positioned at the fluid inlet and outlet, including one seal with a perimeter of the same order of magnitude as the perimeter of the electrical module to be cooled. It is desirable to reduce the zones to be sealed as much as possible in order to reduce the probability of the coolant leaking and allow the use of standard seals.

In order to at least partially overcome these drawbacks, it is desirable for the power electrical device incorporating a cooling system to have a modular structure, to form an independent, sealed assembly, in order to allow standardization and simplified, lower cost manufacturing of power electrical devices, in particular having a reduced set of zones to be sealed.

The invention thus proposes a modular electrical assembly comprising an integrated cooling system, configured to form part of a power electrical device.

PRESENTATION OF THE INVENTION

More specifically, the invention relates to an electrical assembly, in particular suitable for being placed on board an electric or hybrid motor vehicle, comprising a casing, at least one electrical module, said at least one electrical module having at least one electrical component to be cooled, a cooling module comprising at least two fluid orifices, to respectively supply and discharge a coolant to and from said cooling module, at least one cooling channel made in said cooling module, configured to form a cooling circuit portion and form a fluid connection between said fluid orifices, said at least one electrical module being attached to said cooling module, in order to ensure the cooling of said at least one electrical module, said casing being attached to said cooling module so as to define a free volume, said free volume accommodating said at least one electrical module so as to form an independent module configured to be attached to a housing of an electrical device.

An electrical assembly according to the invention has the resulting advantage of limiting the zones to be sealed, thus reducing the risks of fluid leaks, and of having a modular structure configured to be attached to an electrical device. As a result, the feature of modularity of the invention simultaneously affects the industrial processes for manufacturing, producing and testing electrical devices. In terms of industrial manufacturing and production, the invention facilitates the standardization of the devices and makes it possible to implement parallel production lines. In terms of testing, the invention provides the option of carrying out leak tests on the electrical assembly according to the invention independently of the rest of the electrical device. As a result, the present invention offers a considerable advantage from the point of view of industrial production of electrical devices.

Advantageously, the electrical assembly according to the invention has an electrical connector, and a through-opening made in the cooling module, the through-opening being configured to allow the connection of the electrical connector to both the electrical module and an electrical module external to the electrical assembly, the electrical connector being capable of providing the electrical connection between the electrical assembly and the electrical device.

According to one embodiment, the electrical module comprises at least one power electronics module, configured to allow the transfer of electrical energy by means of the electrical assembly.

According to one embodiment, the cooling module comprises a first face to which the electrical module is attached, a second face opposite the first face, and a lateral face connecting said first face and said second face of the cooling module.

According to one embodiment, one of the two fluid orifices, denoted first fluid orifice, emerges on said first face or said lateral face of the cooling module.

According to one embodiment, one of the two fluid orifices, denoted second fluid orifice, emerges on said second face of the cooling module.

According to one embodiment, each of the two fluid orifices consists of a nozzle, a spigot or a bare orifice, having sealing means, capable of connecting the cooling circuit portion of the cooling module and different cooling circuit portions external to the electrical assembly.

Advantageously, a power electronics device, in particular suitable for being placed on board an electric or hybrid motor vehicle, comprises a housing accommodating an electrical component, and two electrical assemblies according to the invention, the two electrical assemblies being attached respectively to the housing, on either side of the housing, so that each of the cooling modules respectively incorporated into each of the two electrical assemblies has a fluid orifice directly facing the housing emerging in particular on said second face opposite said first face adjacent to the respective electrical module of the electrical assembly.

Advantageously, the cooling modules respectively incorporated into each of the two electrical assemblies of the power electrical device each have a face facing the electrical component accommodated in the housing of the power electrical device, at least one of the two faces being in direct mechanical contact with the electrical component accommodated in said housing, in order to ensure the cooling of the electrical component by one or both of the cooling modules.

Advantageously, the power electrical device comprises an electrical connection system, so as to ensure the respective electrical connection of each of the power electronics modules incorporated into each of the two electrical assemblies to the electrical component accommodated in the housing.

According to one embodiment, the power electrical device forms a DC/DC converter, an electrical charger or an inverter.

The invention further relates to a power electrical device, in particular suitable for being placed on board an electric or hybrid motor vehicle, comprising a housing accommodating at least one electrical component, and at least one electrical assembly according to the invention, the electrical assembly being attached to the housing.

According to one embodiment, said casing of the at least one electrical assembly and said housing of the electrical device form external walls of said power electrical device.

The power electrical device can have any one of the features described above. In particular, according to one embodiment, the power electrical device comprises two electrical assemblies according to the invention, the two electrical assemblies being attached respectively to the housing, on either side of said housing, so that each of the cooling modules respectively incorporated into each of the two electrical assemblies has a fluid orifice directly facing the housing emerging in particular on said second face opposite said first face adjacent to the respective electrical module of the electrical assembly.

PRESENTATION OF THE FIGURES

The invention will be better understood upon reading the following description, which is given by way of example and with reference to the following figures, given by way of non-limiting examples, in which identical reference signs are given to similar objects:

It should be noted that the figures disclose the invention in detail in order to implement the invention, it being of course possible for said figures to serve to better define the invention if necessary.

DETAILED DESCRIPTION OF THE INVENTION

In the description below, the invention will be described in the context of a power electrical device, in particular suitable for being placed on board an electric or hybrid motor vehicle. However, this does not constitute a limitation to this particular application, and the invention can be implemented in any electrical device requiring the cooling of some of its electrical components.

Figure 1:
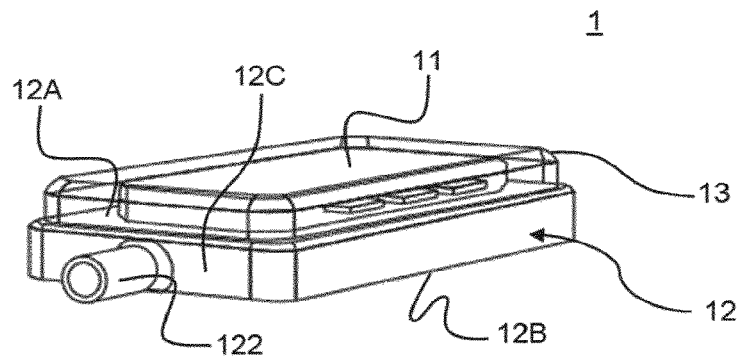
FIG. 1 shows a view of an example of an electrical assembly according to the invention.

With reference to FIG. 1, the invention relates to an electrical assembly 1 comprising a casing 13, at least one electrical module 11, said at least one electrical module 11 having at least one electrical component to be cooled, a cooling module 12 comprising at least two fluid orifices 122-123, for respectively supplying and discharging a coolant to and from the cooling module 12, and at least one cooling channel 121 made in said cooling module 12, configured to form a cooling circuit portion and fluidly connect said fluid orifices 122-123. In particular, the casing 13 is a cover for the electrical module 11.

Said at least one electrical module 11 is attached to said cooling module 12 in order to ensure the cooling of said at least one electrical module 11. In particular, the cooling module 12 comprises a first face 12A on which said electrical module 11 is attached, a second face 12B opposite said first face 12A, and a lateral face 12C connecting the two opposite faces 12A and 12B. According to one embodiment, one of said at least two fluid orifices 122-123 emerges on said first face 12A or said lateral face 12C of the cooling module 12, in which case said corresponding fluid orifice is denoted first fluid orifice 122, and another of said at least two fluid orifices 122-123 emerges on said second face 12B of the cooling module 12, and said corresponding fluid orifice is denoted second fluid orifice 123.

Said casing 13 is attached to said cooling module 12 so as to define a free volume, said free volume accommodating said at least one electrical module 11, so that together they form a sealed independent module, configured to be attached to a housing 2 of an electrical device, in particular a power electrical device.

An electrical assembly 1 according to the invention is thus described as an "independent module" in that it allows direct mounting of said electrical assembly 1 on a power electrical device without breaching the integrity of the electrical assembly 1. As a result, it is in particular possible to test an electrical assembly 1 independently, before attaching it to a housing 2, so that if a fault is detected when the electrical assembly 1 is mounted on the housing 2, said electrical assembly remains approved and it is simply necessary to mount it on another functional housing 2.

The invention further comprises the mounting of the electrical module 11 on the cooling module 12 and the mounting of the casing 13 on said electrical module 11 and on the cooling module 12 so as to cover the electrical module 11, for example by means of a plurality of screws, in order to provide mechanical protection for the electrical assembly 1 and in particular the electrical module 11.

According to one embodiment, the invention also comprises at least one electrical connector 14, and at least one through-opening 124 made in the cooling module 12, said at least one through-opening 124 being configured to allow the connection of said at least one electrical connector 14 to both the electrical module 11 and an electrical module external to the electrical assembly 1, said at least one electrical connector 14 being capable of providing the electrical connection between the electrical assembly 1 and a power electrical device.

Figure 4:
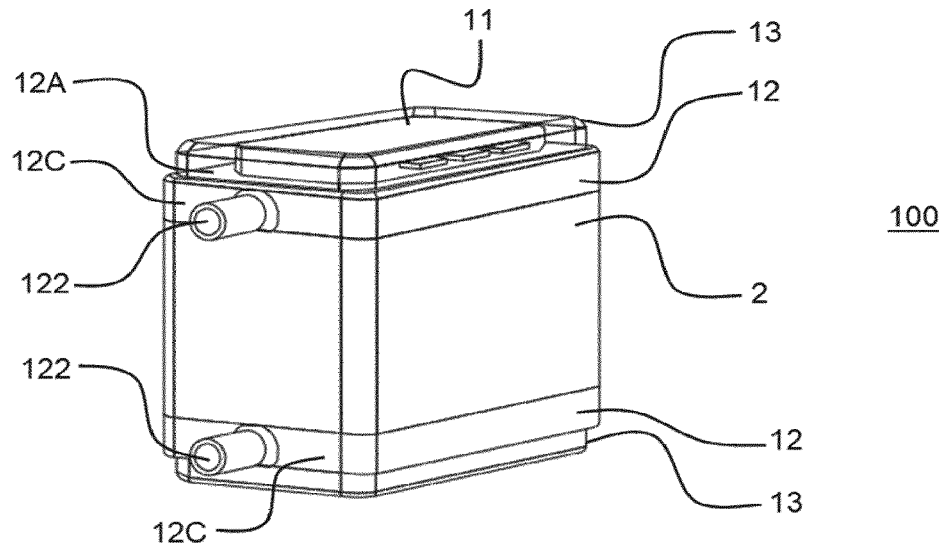
FIG. 4 shows a view of an example of an electrical device comprising two examples of electrical assemblies according to the invention.
Figure 5:
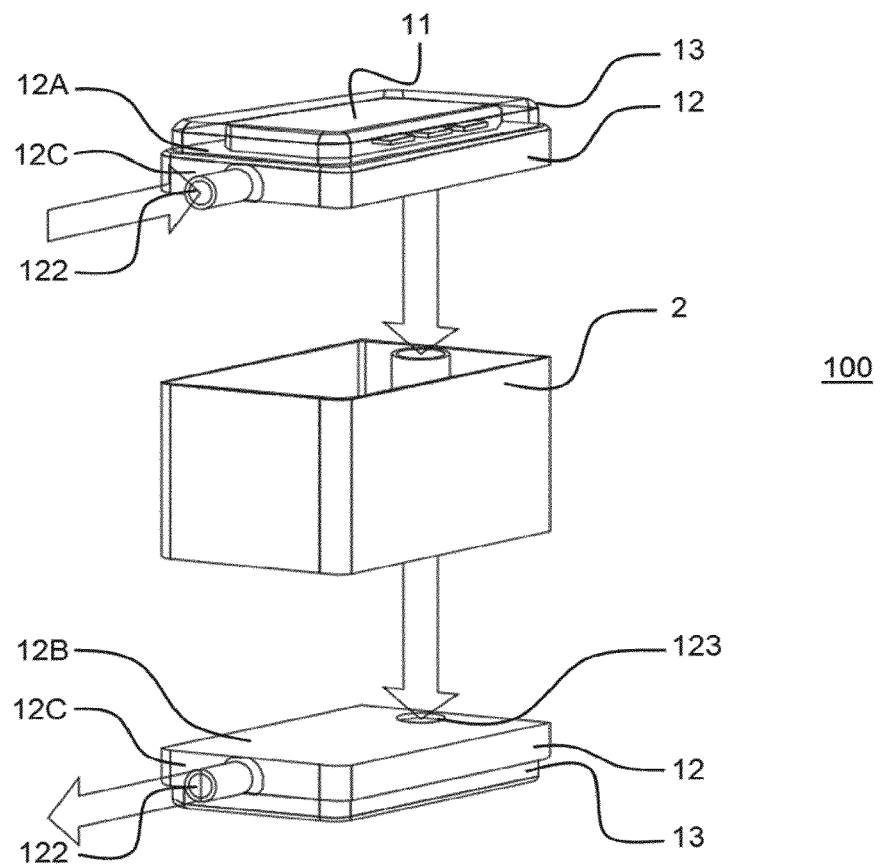
FIG. 5 shows an exploded view of an example of an electrical device comprising two examples of electrical assemblies according to the invention.

By way of exemplary embodiment, FIGS. 4 and 5 show a power electrical device 100 comprising a housing 2 accommodating at least one electrical component, in particular a capacitor module, and two of the electrical assemblies 1 according to the invention, attached respectively one either side of the housing 2, so that each of the cooling modules 12 respectively incorporated into each of the two electrical assemblies 1 has a face directly facing the capacitor module accommodated in the housing 2, at least one of the two faces being in direct mechanical contact with the capacitor module accommodated in said housing 2, in order to ensure the cooling of said capacitor module by at least one of the cooling modules 12 of said two electrical assemblies 1. With reference to FIG. 5, the direction of flow of the coolant shown is not limiting; this is merely an illustration used to represent one possible topology of the cooling circuit. The operating temperatures of the different electrical components, and in general the priority given to the cooling of any given electrical component, partially determine the direction of flow of the coolant.

According to one embodiment of the invention, said cooling module 12 of the electrical assembly 1 according to the invention comprises fastening means on the face 12B, configured to allow said electrical component accommodated in the housing 2 to be mounted on the electrical assembly 1. As a result, according to a first embodiment of the power electrical assembly 100 illustrated in FIGS. 4 and 5, the electrical component accommodated in the housing 2 is mounted directly on the electrical assembly 1. According to a second embodiment of the power electrical assembly 100 illustrated in FIGS. 4 and 5, the electrical component accommodated in the housing 2 is mounted on an element external to the electrical assembly 1 according to the invention, and in particular on the housing 2.

Figure 6:
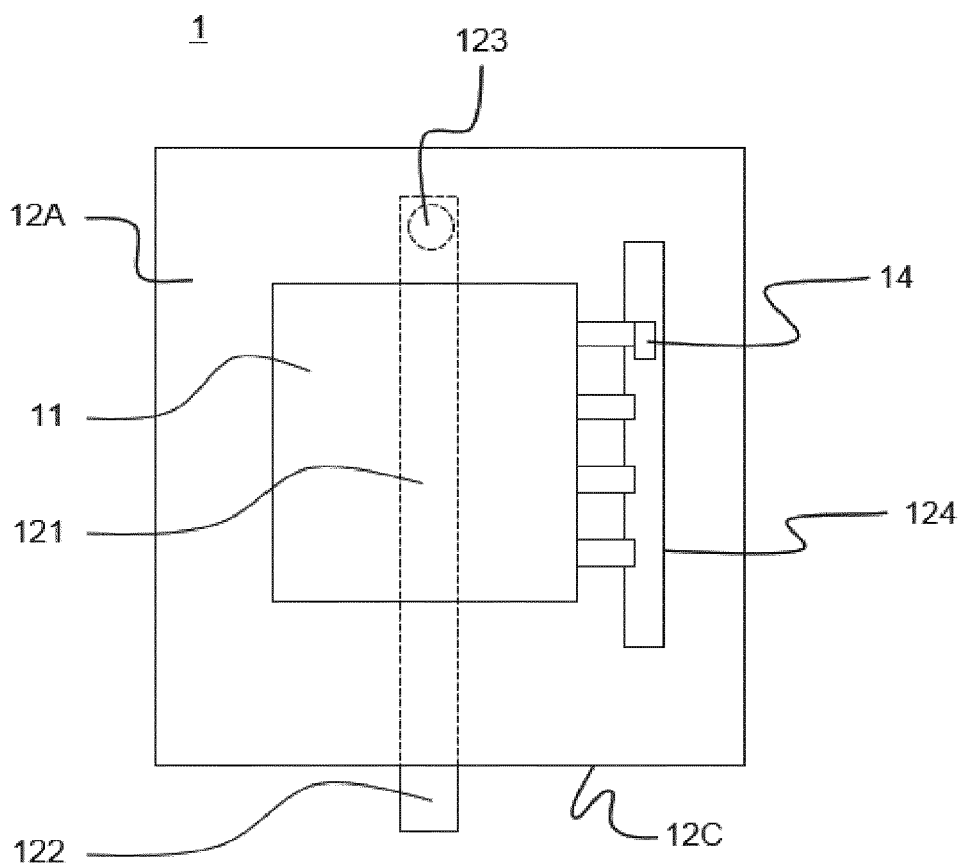
FIG. 6 shows a view of an example of an electrical assembly according to the invention.

In addition, the power electrical device 100 illustrated in FIGS. 4 and 5 by way of example comprises at least one electrical connection system, so as to ensure the respective electrical connection of each of the power electronics modules of the two electrical assemblies 1 to the capacitor module accommodated in the housing 2. Said electrical connection system comprises in particular the electrical connector 14, an example of which is illustrated in FIG. 6.

It will be noted that the cooling circuit is not necessarily incorporated into the casting that is said housing 2, which simplifies the design, manufacturing and testing thereof, and thus makes it possible to reduce the costs incurred. However, the housing 2 can comprises an intermediate cooling circuit portion, which is in particular simple so as not to complicate the design and manufacturing thereof. The intermediate cooling circuit portion makes it possible in particular to guide the coolant from one independent electrical assembly 1 to the other. By way of example, with reference to the power electrical device 100 illustrated in FIGS. 4 and 5, the intermediate cooling circuit portion of the housing 2 makes it possible to guide the coolant between two of said respective second fluid orifices 123 of the two independent electrical assemblies 1. In this embodiment, the remaining two fluid orifices 122, in other words those that do not provide a connection to the intermediate cooling circuit portion of the housing 2, can be situated on the first face 12A or on the lateral face 12C respectively of each of the two cooling modules 12.

In detail, said casing 13 makes it possible to dispense with a housing that covers the whole of the power electrical device in one piece, and thereby increases the modularity imparted by the invention.

According to one embodiment, the material of said casing 13 consists in particular of an electrically and/or electromagnetically insulating material, in order to ensure the electrical and/or electromagnetic insulation of said electrical module 11 respectively.

In addition, according to the embodiment, the material of the casing 13 can differ from the material of the cooling module 12 and the material of the housing 2, so as to allow a saving, for example in terms of cost, or to obtain different physical properties.

The electrical module 11 will now be described in detail. According to one embodiment, the electrical module 11 comprises at least one power electronics module 11, configured to allow the transfer of electrical energy by means of said electrical assembly 1.

In addition, said at least one power electronics module 11 comprises a base plate, forming an interface between said at least one electrical component to be cooled and the cooling module 12, so as to perform a heat exchanger function between said at least one electrical component to be cooled and the cooling module 12.

Said cooling module 12 forms in particular a generally parallelepipedal sealed system, comprising a cooling circuit portion, configured to allow the optimum flow of said coolant according to the physical distribution of the electrical components to be cooled.

Figure 2:
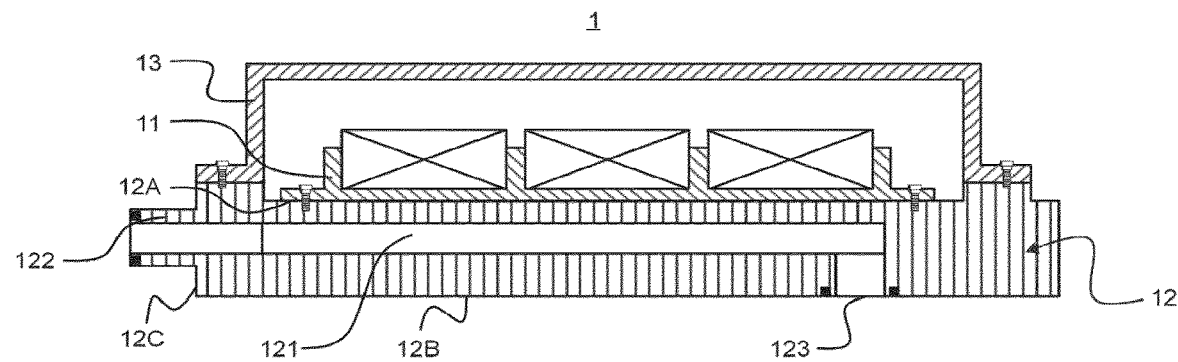
FIG. 2 shows a cross-sectional view of an example of an electrical assembly according to the invention.

According to one embodiment of the electrical assembly 1, with reference to FIG. 2, the cooling module 12 has a cavity accommodating said at least one cooling channel 121, said base plate being in direct mechanical contact with the cooling module 12 on the first face 12A, in order to ensure the cooling of the power electronics module 11 by conduction. This embodiment of an electrical assembly 1 according to the invention has the advantage of limiting the zones to be sealed in the electrical assembly 1.

Figure 3:
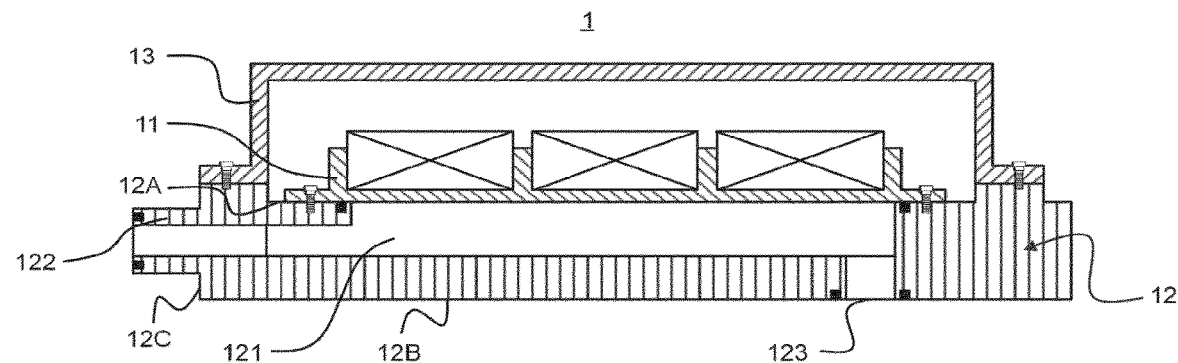
FIG. 3 shows a cross-sectional view of an example of an electrical assembly according to the invention.

According to one embodiment of the electrical assembly 1, with reference to FIG. 3, said at least one cooling channel 121 has a partial opening emerging on the first face 12A of said cooling module 12 facing said base plate. Said partial opening cools said at least one power electronics module 11 by placing said base plate in direct contact with the coolant. Said base plate has in particular a substantially planar surface or a surface comprising pins protruding into the cooling channel 121, depending on the cooling efficiency sought. This embodiment of an electrical assembly 1 according to the invention has zones to be sealed around the partial opening of said cooling channel 121, but allows improved cooling compared to the electrical assembly 1 according to the embodiment shown in FIG. 2.

It goes without saying that said cooling module is not limited to these two embodiments, which are described by way of example only. The embodiment selected will mainly be the result of a compromise between the cooling efficiency sought and the extent of the zones to be sealed.

In addition, depending on the embodiment selected, the fluid orifices 122-123 can take the form of a nozzle, a spigot or a bare orifice, provided with a sealing system. The fluid orifices 122-123 can take different forms from each other.

In addition, there is no particular restriction on the physical location of the fluid inlet and said fluid outlet according to the invention, provided that they allow the implementation of the cooling circuit of the power electrical device 100. By way of example, a first fluid orifice 122 can form the inlet of the cooling module 12 and a second fluid orifice 123 can form the outlet of the cooling module 12, or vice versa. However, a bulky fluid orifice, such as a spigot or a nozzle, generally extends from the lateral face 12C in the plane of the cooling module 12.

In summary, an electrical assembly according to the invention comprising an integrated cooling system and configured to form part of a power electrical device has the advantages of limiting the zones to be sealed and having a modular structure.

In particular, the zones to be sealed are limited to said fluid orifices 122-123 and, if applicable, to a partial opening zone of the cooling module 12 according to one embodiment of the invention.

The feature of modularity of the invention allows the independent distribution of functional attributes by element of a power electrical device. In particular, by way of example, the cooling function can be provided by an electrical assembly according to the invention. In addition, an electrical assembly according to the invention or elements of the power electrical device external to the invention can perform functions of electrical and/or electromagnetic insulation of the power electrical device.

As a result, the feature of modularity of the invention simultaneously affects the industrial processes for manufacturing, producing and testing power electrical devices.

In terms of industrial manufacturing and production, the invention facilitates the standardization of the devices and makes it possible to implement parallel production lines, for example, one for the assembly of the power electronics module 11 on the cooling module 12 and the other for the assembly of an electrical module on the housing 2. Furthermore, it becomes possible to implement technologies for producing the housing 2 that are simpler and better suited to mass production.

In addition, the invention provides the option of carrying out leak tests on the electrical assembly 1 according to the invention independently of the housing 2.

Thus, if a malfunction of the sealing system was detected, only the electrical assembly 1 according to the invention would be scrapped. In the prior art, the very design of the power electrical device as described in the preamble does not allow such a test to be performed separately. As a result, the power electrical device in the prior art is tested, in terms of sealing, in its entirety and if a sealing problem is detected, the whole power electrical device must be scrapped.

As a result, the present invention offers a considerable advantage from the point of view of industrial production of power electrical devices.

In particular, as illustrated for example in FIGS. 4 and 5, the casing 11 and the housing 2 form external walls of the power electrical device 100. In particular, the casing 11 and the housing 2 provide mechanical protection for the components of the power electrical device 100 against external attacks on the power electrical device 100. There is therefore no need to provide an additional housing of the electrical device 100 in which the electrical assembly 1 and the housing 2 would be received.

The invention claimed is:

1. An electrical assembly, suitable for being placed on board an electric or hybrid motor vehicle, comprising:
    a casing,
    at least one electrical module, said at least one electrical module having at least one electrical component to be cooled,
    a cooling module comprising:
        at least two fluid orifices, for respectively supplying and discharging a coolant to and from the cooling module,
        at least one cooling channel made in said cooling module, configured to form a cooling circuit portion and fluidly connect said fluid orifices,
    said at least one electrical module being attached to said cooling module, in order to ensure the cooling of said at least one electrical module,
    said casing being attached to said cooling module so as to define a free volume, said free volume accommodating said at least one electrical module so as to form an independent module configured to be attached to a housing of an electrical device.

2. The electrical assembly as claimed in claim 1, wherein it has at least one electrical connector, and at least one through-opening made in the cooling module, said at least one through-opening being configured to allow the connection of said at least one electrical connector to both the electrical module and an electrical module external to the electrical assembly, said at least one electrical connector being capable of providing the electrical connection between said electrical assembly and said electrical device.

3. The electrical assembly as claimed in claim 1, wherein said at least one electrical module comprises at least one power electronics module, configured to allow the transfer of electrical energy by means of said electrical assembly.

4. The electrical assembly as claimed in claim 1, wherein the cooling module comprises a first face on which said electrical module is attached, a second face opposite said first face, and a lateral face connecting said first face and said second face.

5. The electrical assembly as claimed in claim 4, wherein one of said at least two fluid orifices, denoted first fluid orifice, emerges on said first face or said lateral face of the cooling module.

6. The electrical assembly as claimed in claim 4, wherein one of said at least two fluid orifices, denoted second fluid orifice, emerges on said second face of the cooling module.

7. The electrical assembly as claimed in claim 1, wherein each of said at least two fluid orifices consists of a nozzle, a spigot or a bare orifice, having sealing means, capable of connecting said cooling circuit portion of the cooling module and different cooling circuit portions external to the electrical assembly.

8. A power electrical device, suitable for being placed on board an electric or hybrid motor vehicle, comprising a housing accommodating at least one electrical component, and at least one electrical assembly as claimed in claim 1, the electrical assembly being attached to the housing.

9. The power electrical device as claimed in claim 8, wherein said casing of the at least one electrical assembly and said housing of the electrical device form external walls of said power electrical device.

10. The power electrical device as claimed in claim 8, comprising two of said electrical assemblies, the two electrical assemblies being attached respectively to the housing, on either side of said housing, so that each of the cooling modules respectively incorporated into each of the two electrical assemblies has a fluid orifice directly facing the housing emerging on a second face opposite a first face adjacent to the respective electrical module of the electrical assembly.

11. The power electrical device as claimed in claim 10, wherein said cooling modules respectively incorporated into each of the two electrical assemblies each have a face facing the electrical component accommodated in the housing, at least one of the two faces being in direct mechanical contact with the electrical component accommodated in said housing, in order to ensure the cooling of the electrical component by one or both of the cooling modules.

12. The power electrical device as claimed in claim 10, comprising at least one electrical connection system, so as to ensure the respective electrical connection of each of the power electronics modules incorporated into each of said two electrical assemblies to the electrical component accommodated in the housing.

13. The electrical assembly as claimed in claim 2, wherein said at least one electrical module comprises at least one power electronics module, configured to allow the transfer of electrical energy by means of said electrical assembly.

14. The electrical assembly as claimed in claim 2, wherein the cooling module comprises a first face on which said electrical module is attached, a second face opposite said first face, and a lateral face connecting said first face and said second face.

15. The electrical assembly as claimed in claim 5, wherein one of said at least two fluid orifices, denoted second fluid orifice, emerges on said second face of the cooling module.

16. The electrical assembly as claimed in claim 2, wherein each of said at least two fluid orifices consists of a nozzle, a spigot or a bare orifice, having sealing means, capable of connecting said cooling circuit portion of the cooling module and different cooling circuit portions external to the electrical assembly.

17. A power electrical device, suitable for being placed on board an electric or hybrid motor vehicle, comprising a housing accommodating at least one electrical component, and at least one electrical assembly as claimed in claim 2, the electrical assembly being attached to the housing.

18. The power electrical device as claimed in claim 9, comprising two of said electrical assemblies, the two electrical assemblies being attached respectively to the housing, on either side of said housing, so that each of the cooling modules respectively incorporated into each of the two electrical assemblies has a fluid orifice directly facing the housing emerging on a second face opposite a first face adjacent to the respective electrical module of the electrical assembly.

19. The power electrical device as claimed in claim 11, comprising at least one electrical connection system, so as to ensure the respective electrical connection of each of the power electronics modules incorporated into each of said two electrical assemblies to the electrical component accommodated in the housing.

20. The electrical assembly as claimed in claim 3, wherein the cooling module comprises a first face on which said electrical module is attached, a second face opposite said first face, and a lateral face connecting said first face and said second face.

* * * * *